United States Patent
Wang et al.

(10) Patent No.: US 10,483,915 B2
(45) Date of Patent: *Nov. 19, 2019

(54) RADIO FREQUENCY CIRCUIT, TRANSMITTER, BASE STATION, AND USER TERMINAL

(71) Applicant: Huawei Technologies Co., Ltd., Shenzhen (CN)

(72) Inventors: Liangfang Wang, Chengdu (CN); Shengbo Wu, Shenzhen (CN); Chenglin Wu, Shenzhen (CN); Wei Huang, Shenzhen (CN); Xiang Feng, Chengdu (CN)

(73) Assignee: Huawei Technologies Co., Ltd., Shenzhen (CN)

(*) Notice: Subject to any disclaimer, the term of this patent is extended or adjusted under 35 U.S.C. 154(b) by 8 days.

This patent is subject to a terminal disclaimer.

(21) Appl. No.: 15/970,400

(22) Filed: May 3, 2018

(65) Prior Publication Data

US 2018/0254744 A1 Sep. 6, 2018

Related U.S. Application Data

(63) Continuation of application No. 15/618,369, filed on Jun. 9, 2017, now Pat. No. 9,985,585, which is a
(Continued)

(51) Int. Cl.
*H04B 1/38* (2015.01)
*H04B 1/04* (2006.01)
(Continued)

(52) U.S. Cl.
CPC .......... *H03F 1/0205* (2013.01); *H03F 1/0294* (2013.01); *H03F 3/19* (2013.01);
(Continued)

(58) Field of Classification Search
CPC .......... H04B 1/04; H04B 1/0483; H04B 1/38; H04B 1/40; H04Q 2011/0015; H03F 2200/451
(Continued)

(56) References Cited

U.S. PATENT DOCUMENTS

| 4,605,902 A | 8/1986 | Harrington |
| 5,898,326 A * | 4/1999 | Okayasu .................. H04B 3/04 326/30 |

(Continued)

FOREIGN PATENT DOCUMENTS

| CN | 1714500 A | 12/2005 |
| CN | 102130657 A | 7/2011 |

(Continued)

OTHER PUBLICATIONS

Johansson, T. et al., "A Review of Watt-Level CMOS RF Power Amplifiers," IEEE Transactions on Microwave Theory and Techniques, vol. 62, No. 1, Jan. 2014, pp. 111-124.
(Continued)

*Primary Examiner* — Quochien B Vuong
(74) *Attorney, Agent, or Firm* — Slater Matsil, LLP

(57) ABSTRACT

The application provides a radio frequency circuit, including: a first circuit and a second circuit. The first circuit is configured to receive a first signal and a second signal; split the first signal into a third signal and a fourth signal, and split the second signal into a fifth signal and a sixth signal; adjust a phase of the fifth signal to obtain a seventh signal; and combine the seventh signal and the third signal into an eighth signal. The second circuit includes a primary power amplifier branch and a secondary power amplifier branch, and the primary power amplifier branch is configured to
(Continued)

process the fourth signal and the sixth signal, and the secondary power amplifier branch is configured to process the eighth signal.

18 Claims, 5 Drawing Sheets

Related U.S. Application Data continuation of application No. PCT/CN2014/093559, filed on Dec. 11, 2014.

(51) Int. Cl.
*H03F 1/02* (2006.01)
*H03F 3/19* (2006.01)
*H03F 3/24* (2006.01)
*H04W 52/02* (2009.01)
*H04W 52/08* (2009.01)

(52) U.S. Cl.
CPC ....... *H03F 3/245* (2013.01); *H03F 2200/451* (2013.01); *H04W 52/0209* (2013.01); *H04W 52/08* (2013.01); *Y02D 70/12* (2018.01); *Y02D 70/122* (2018.01)

(58) Field of Classification Search
USPC ... 455/127.1, 127.2, 127.3, 127.4, 561, 574, 455/127.5
See application file for complete search history.

(56) References Cited

U.S. PATENT DOCUMENTS

| | | | |
|---|---|---|---|
| 8,260,143 | B2 | 9/2012 | Gupta et al. |
| 8,779,826 | B1 | 7/2014 | Chang et al. |
| 8,948,306 | B2 * | 2/2015 | Borodulin ................ H03F 3/19 |
| | | | 330/295 |
| 8,965,454 | B2 | 2/2015 | Vella-Coleiro et al. |
| 9,083,294 | B2 | 7/2015 | Kermalli |
| 9,397,617 | B2 * | 7/2016 | Jeon ...................... H03F 1/0288 |
| 9,595,920 | B2 | 3/2017 | Avniel et al. |
| 9,813,036 | B2 * | 11/2017 | Folkmann ................ H03F 3/68 |
| 2005/0280466 | A1 | 12/2005 | Gailus et al. |
| 2006/0114060 | A1 | 6/2006 | Hellberg et al. |
| 2010/0045385 | A1 | 2/2010 | Pengelly |
| 2012/0294387 | A1 | 11/2012 | Ghannouchi et al. |
| 2013/0196714 | A1 | 8/2013 | Yin et al. |
| 2013/0314280 | A1 | 11/2013 | Maltsev et al. |
| 2014/0340157 | A1 | 11/2014 | Xue et al. |
| 2016/0142022 | A1 | 5/2016 | Wang et al. |

FOREIGN PATENT DOCUMENTS

| | | |
|---|---|---|
| CN | 102710220 A | 10/2012 |
| CN | 102752011 A | 10/2012 |
| CN | 103891137 A | 6/2014 |
| CN | 104167995 A | 11/2014 |
| JP | 2002124840 A | 4/2002 |
| WO | 2004057755 A1 | 7/2004 |

OTHER PUBLICATIONS

Gardner, P. et al., "Linearity and Efficiency Enhancement Techniques in Microwave Transmitters," 2011 IEEE International RF and Microwave Conference (RFM 2011), Dec. 12-14, 2011, pp. 31-35.

Hamedi-Hagh, S. et al., "CMOS Wireless Phase-Shifted Transmitter," IEEE Journal of Solid-State Circuits, vol. 39, No. 8, Aug. 2004, pp. 1241-1252.

* cited by examiner

RADIO FREQUENCY CIRCUIT, TRANSMITTER, BASE STATION, AND USER TERMINAL

CROSS-REFERENCE TO RELATED APPLICATIONS

This application is a continuation of U.S. patent application Ser. No. 15/618,369, filed Jun. 9, 2017, which is a continuation of International Application No. PCT/CN2014/093559, filed on Dec. 11, 2014. All of the afore-mentioned patent applications are hereby incorporated by reference in their entireties.

TECHNICAL FIELD

The present disclosure relates to the communications field, and in particular, to a radio frequency circuit, a transmitter, a base station, and a user terminal.

BACKGROUND

In a radio base station, energy consumption of a radio frequency power amplifier accounts for a very high proportion in total energy consumption of the base station device. To reduce energy consumption, a dual-input radio frequency circuit, for example, an outphasing circuit, or a Doherty (DHT) circuit including a primary power amplifier and a secondary power amplifier, is usually used to improve power amplification efficiency. However, when the conventional dual-input radio frequency circuit is used to improve back-off efficiency, efficiency between a power back-off point and a high power point may be significantly reduced. Finally, efficiency of a device, such as the base station, for outputting a modulated wave is affected.

To improve the significantly reduced efficiency of the dual-input radio frequency circuit, in the prior art, a DHT circuit and an outphasing circuit are combined to form a composite radio frequency circuit. That is, the outphasing circuit is used as a primary power amplifier of the DHT circuit, and then a secondary power amplifier is added to perform load modulation). The composite radio frequency circuit can effectively improve the significantly reduced efficiency of the dual-input radio frequency circuit between the power back-off point and the high power point. However, a quantity of input signals of the dual-input radio frequency circuit is increased from original two to three, and consequently a size of the entire composite radio frequency circuit becomes excessively large. In addition, to provide three input signals to the composite radio frequency circuit, three transmit channels need to be disposed for the composite radio frequency circuit. Therefore, the composite radio frequency circuit has relatively high use costs, unfavorable to large-scale application and popularization.

To reduce a quantity of transmit channels, in a common prior-art method, signals transmitted on two transmit channels are converted into three input signals by performing an operation such as splitting or combination, and the three input signals are connected to the composite radio frequency circuit. However, after three input signals are obtained using this method, when the signals transmitted on the two transmit channels are adjusted, at least one input signal cannot be adjusted to an expected value. Consequently, the composite radio frequency circuit at rated power cannot reach optimal power amplification efficiency, and overall performance of the circuit is poor.

SUMMARY

Embodiments of the present disclosure provide a radio frequency circuit, so as to reach optimal power amplification efficiency. The embodiments of the present disclosure further provide a transmitter, a base station, and a user terminal.

According to a first aspect, an embodiment of the present disclosure provides a radio frequency circuit, including a first circuit and a second circuit. The first circuit is configured to: receive a first signal and a second signal. The first circuit is also configured to split the first signal into a third signal and a fourth signal, and split the second signal into a fifth signal and a sixth signal. The first circuit is also configured to adjust a phase of the fifth signal to obtain a seventh signal. The first circuit is also configured to combine the seventh signal and the third signal into an eighth signal. The second circuit includes a primary power amplifier branch and a secondary power amplifier branch. The primary power amplifier branch includes an outphasing circuit. The secondary power amplifier branch includes a secondary power amplifier. The outphasing circuit is configured to process the fourth signal and the sixth signal. The secondary power amplifier is configured to process the eighth signal.

In a first possible implementation manner of the first aspect, the first circuit further includes a microstrip, the microstrip is configured to adjust the phase of the fifth signal, and a length of the microstrip is directly proportional to a phase shift of the fifth signal.

With reference to the foregoing possible implementation manner, in a second possible implementation manner of the first aspect, the first circuit further includes an attenuation network and a combiner; the attenuation network is configured to attenuate the seventh signal and the third signal; and the combiner is configured to combine the attenuated seventh signal and the attenuated third signal into the eighth signal.

With reference to either of the foregoing possible implementation manners, in a third possible implementation manner of the first aspect, the first signal and the second signal are obtained by performing phase decomposition on a modulated signal, including: a phase of the first signal is $\varphi(t)$, a phase of the second signal is $-\varphi(t)$, a value of $p\varphi(t)$ ranges from 0° to 90°, an amplitude of the first signal is equal to an amplitude of the second signal, $\varphi(t)$ is a time-related function, $t \geq 0$, and t indicates time.

With reference to any one of the foregoing possible implementation manners, in a fourth possible implementation manner of the first aspect, the secondary power amplifier being configured to process the eighth signal includes: the eighth signal is input from a signal input end of the secondary power amplifier; and when an amplitude of the eighth signal reaches a signal threshold, the secondary power amplifier is started to perform amplification processing on the eighth signal, where the signal threshold is a minimum signal amplitude required to start the secondary power amplifier, and a value of a conduction angle of the secondary power amplifier is greater than 120°.

According to a second aspect, an embodiment of the present disclosure provides a transmitter, including the radio frequency circuit provided in the first aspect.

According to a third aspect, an embodiment of the present disclosure provides a base station, including the transmitter provided in the second aspect, where the base station further includes a communications interface, a processor, and a power supply.

According to a fourth aspect, an embodiment of the present disclosure provides a user terminal, including the transmitter provided in the second aspect, where the user terminal further includes a memory, an external port, a peripheral interface, a processor, and a power supply.

The embodiments of the present disclosure provide a radio frequency circuit, including: a first circuit and a second circuit. The first circuit is configured to receive a first signal and a second signal. The first circuit is also configured to split the first signal into a third signal and a fourth signal, and split the second signal into a fifth signal and a sixth signal. The first circuit is also configured to adjust a phase of the fifth signal to obtain a seventh signal. The first circuit is also configured to combine the seventh signal and the third signal into an eighth signal. The second circuit includes a primary power amplifier branch and a secondary power amplifier branch. The primary power amplifier branch includes an outphasing circuit. The secondary power amplifier branch includes a secondary power amplifier. The primary power amplifier branch is configured to process the fourth signal and the sixth signal. The secondary power amplifier branch is configured to process the eighth signal. In the embodiments of the present disclosure, different first signals and second signals correspond to different fourth signals and sixth signals, and the eighth signal may be controlled by performing phase adjustment on the fifth signal. Therefore, the fourth signal, the sixth signal, and the eighth signal that are input to the second circuit can be adjusted to optimal parameters matching the second circuit, the second circuit at rated power can reach highest efficiency, performance of a circuit is good, and an actual application requirement can be satisfied.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Embodiments of the present disclosure provide a radio frequency circuit, to improve output power and efficiency of a circuit, and the following provides detailed description.

Figure 1:
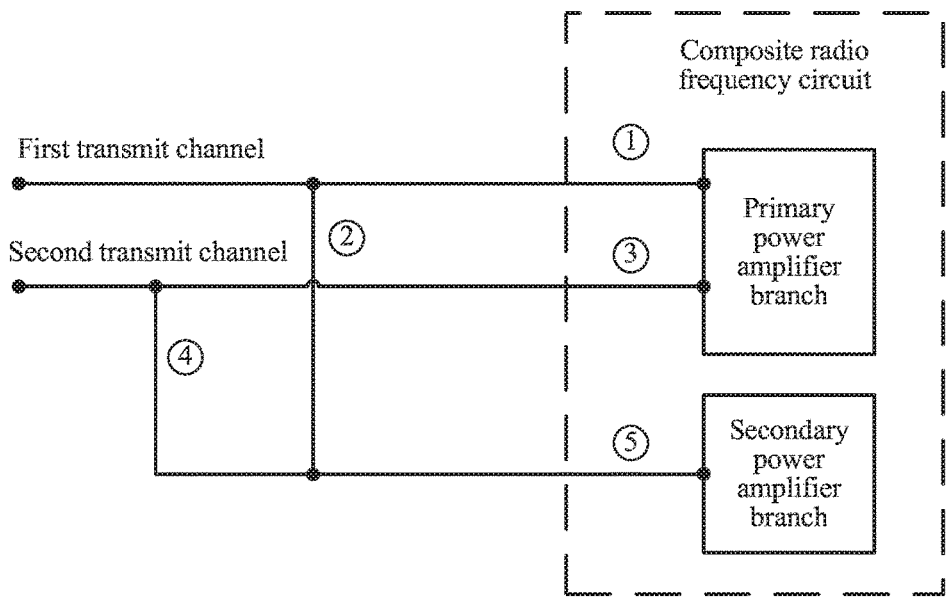
FIG. 1 is a schematic structural diagram of a composite radio frequency circuit in the prior art.

In the prior art, a composite radio frequency circuit includes a primary power amplifier branch and a secondary power amplifier branch. For a structure of a circuit providing an input signal to the composite radio frequency circuit, refer to FIG. 1. A signal transmitted on a first transmit channel is split into a signal ① and a signal ②, and a signal transmitted on a second transmit channel is split into a signal ③ and a signal ④. The signal ① and the signal ③ are used as input of the primary power amplifier branch of the composite radio frequency circuit, and a signal ⑤ obtained by combining the signal ② and the signal ④ is used as input of the secondary power amplifier branch of the composite radio frequency circuit. Signal splitting and combination are implemented by a circuit or component such as a coupler and a power splitter, and a splitting rule depends on a characteristic of a circuit or component that performs splitting. For example, it is assumed that a phase shift of the circuit providing the input signal to the composite radio frequency circuit is 0, the signal transmitted on the first transmit channel is $A_1 e^{j\Phi_1}$, the signal transmitted on the second transmit channel is $A_2 e^{j\Phi_2}$, and a power splitter ranging from 0° to 90° is used to perform splitting and combination. After the splitting, the signal ① is $$\frac{A_1}{\sqrt{2}} e^{j\phi_1},$$

the signal ② is $$\frac{A_1}{\sqrt{2}} e^{j(\phi_1 - \frac{\pi}{2})},$$

the signal ③ is $$\frac{A_2}{\sqrt{2}} e^{-j\phi_2},$$

and the signal ④ is $$\frac{A_2}{\sqrt{2}} e^{-j(\phi_2 + \frac{\pi}{2})}.$$

After the combination, the signal ⑤ is $$\frac{A_1}{\sqrt{2}} e^{j(\phi_1 - \pi)} + \frac{A_2}{\sqrt{2}} e^{-j(\phi_2 + \frac{\pi}{2})}.$$

$A_1$ is a peak of the signal transmitted on the first transmit channel, $\phi_1$ is a phase of the signal transmitted on the first transmit channel, $A_2$ is a peak of the signal transmitted on the second transmit channel, and $\phi_2$ is a phase of the signal transmitted on the second transmit channel. It may be learned from the foregoing example that, after the circuit structure is determined, the parameters $A_1$, $\phi_2$, $A_2$, and $\phi_2$ of the first transmit channel and the second transmit channel need to be adjusted to ensure that amplitudes and phases of the signal ① and the signal ③ always are respective expected values. Consequently, an amplitude and a phase of the signal ⑤ that is input to the secondary power amplifier branch is also unchanged and cannot be adjusted to an expected value of the signal ⑤. Regardless of how to adjust the signals transmitted on the first transmit channel and the second transmit channel, at least one of the signal ①, the signal ③, or the signal ⑤ cannot be adjusted to an expected value.

To resolve the foregoing problem, an embodiment of the present disclosure provides a radio frequency circuit. For a schematic structural diagram, refer to FIG. 2. The radio frequency circuit mainly includes a first circuit 201, configured to: receive a first signal and a second signal; split the first signal into a third signal and a fourth signal, and split the second signal into a fifth signal and a sixth signal. The first circuit 201 is also configured to adjust a phase of the fifth signal to obtain a seventh signal. The first circuit 201 is also configured to combine the seventh signal and the third signal into an eighth signal. The radio frequency circuit also includes a second circuit 202, including a primary power amplifier branch and a secondary power amplifier branch. The primary power amplifier branch includes an outphasing circuit. The secondary power amplifier branch includes a secondary power amplifier. The outphasing circuit is configured to process the fourth signal and the sixth signal. The secondary power amplifier is configured to process the eighth signal.

The first signal and the second signal are input signals of the first circuit 201, and different first signals and second signals correspond to different fourth signals and sixth signals. Specifically, after being split, different first signals correspond to different fourth signals; and after being split, different second signals correspond to different sixth signals.

The seventh signal obtained by performing phase adjustment on the fifth signal obtained by splitting the second signal is combined with the third signal obtained by splitting the first signal, to form the eighth signal. Therefore, different degrees of phase shifts occur on the fifth signal by performing phase adjustment on the fifth signal, and the eighth signal can be controlled.

This embodiment provides a radio frequency circuit, including a first circuit 201 and a second circuit 202. It may be understood that the second circuit 202 at rated power can reach highest efficiency only when all three input signals that are input to the second circuit 202 are adjusted to optimal parameters matching the second circuit 202. In this embodiment, a fourth signal and a sixth signal may be controlled by adjusting a first signal and a second signal, and an eighth signal may be controlled by performing phase adjustment on a fifth signal. In this way, all the fourth signal, the sixth signal, and the eighth signal that are input to the second circuit 202 can be flexibly adjusted to the optimal parameters matching the second circuit 202, the second circuit 202 at the rated power can reach highest efficiency, and an actual application requirement can be satisfied.

Optionally, the first circuit 201 further includes a microstrip, configured to adjust the phase of the fifth signal. A length of the microstrip is directly proportional to a phase shift of the fifth signal. A longer microstrip leads to a larger phase shift of the fifth signal. Alternatively, in this embodiment of the present disclosure, a delay line, a variable capacitance diode, a phase shifter, or another circuit or component may be used to adjust the phase of the fifth signal. This is not limited herein.

Optionally, in another embodiment of the present disclosure, the first signal and the second signal may be obtained by performing phase decomposition on a modulated signal in a digital domain. The first signal and the second signal have identical amplitudes and reverse phases. The amplitudes or the phases of the first signal and the second signal may be adjusted by adjusting an amplitude or a phase of the modulated signal. The modulated signal is usually obtained by performing envelope modulation on a sine wave signal. When the phase decomposition is performed in the digital domain, a correspondence between the amplitude of the modulated signal and a decomposition phase of the modulated signal is as follows:

$$\varphi(t) = \arccos \frac{r(t)}{r_{max}}, \quad (1)$$

where $\varphi(t)$ indicates an instantaneous value of the decomposition phase of the modulated signal, $r(t)$ indicates an instantaneous value of the amplitude of the modulated signal, $r_{max}$ indicates a peak of the amplitude of the modulated signal, $\varphi(t)$ is a time-related function, $t \geq 0$, t indicates time, and $0 < \varphi(t) < 90°$.

It may be learned from formula (1) that the decomposition phase of the modulated signal varies with the amplitude of the modulated signal. At a specific moment, a larger amplitude of the modulate signal leads to a smaller decomposition phase of the modulate signal, or a smaller amplitude of the modulated signal leads to a larger decomposition phase of the modulate signal.

After the phase decomposition described in formula (1) is performed, the modulated signal is decomposed into the first signal and the second signal. Amplitudes of the first signal and the second signal are equal and not greater than $r_{max}$, the phase of the first signal is $\varphi(t)$, and the phase of the second signal is $-\varphi(t)$.

The amplitudes of the first signal and the second signal are equal. The amplitudes and the phases vary with time. Therefore, amplitudes and phases of the third signal, the fourth signal, the fifth signal, and the sixth signal that are obtained after the splitting, and the seventh signal obtained by performing phase adjustment on the fifth signal also vary with time. Because the eighth signal is obtained by combining the seventh signal and the third signal, an amplitude of the eighth signal is related to the phases of the seventh signal and the third signal. Phase adjustment is performed on the fifth signal, so that different degrees of shifts occur on the phase of the fifth signal, and obtained eighth signals have different phase-amplitude curves. For a specific application example, refer to FIG. 3.

Figure 3:
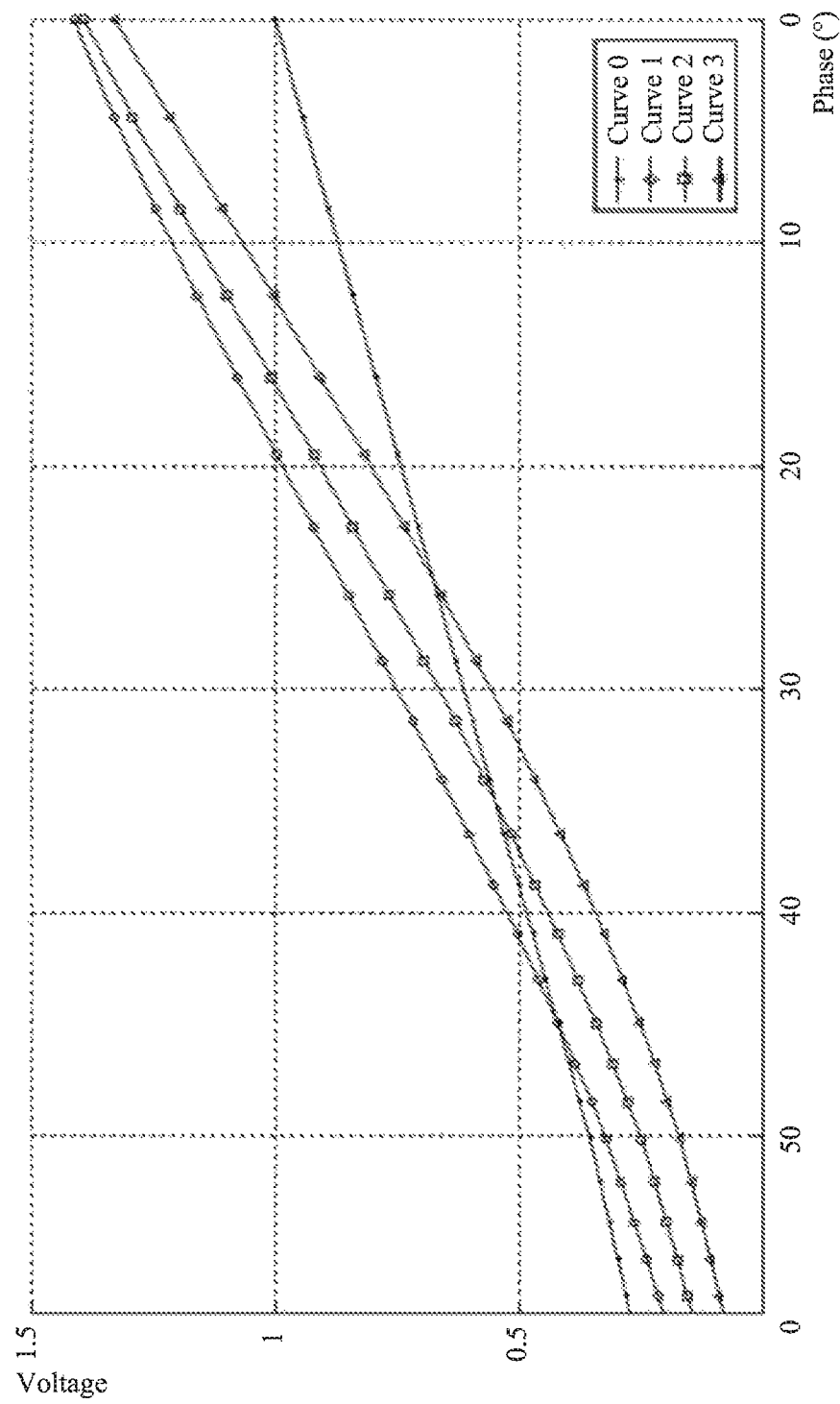
FIG. 3 shows an input/output characteristic curve of a specific example circuit of a first circuit according to an embodiment of the present disclosure.

FIG. 3 shows an input/output characteristic curve of a specific example circuit of the first circuit 201. A horizontal coordinate axis indicates the decomposition phase of the modulated signal, that is, a phase value of the first signal. A vertical coordinate axis indicates a voltage amplitude of the eighth signal that is obtained by normalizing a maximum voltage value of the modulated signal. Different curves indicate eighth signals corresponding to different phase shifts of the fifth signal. Curve 1 indicates an eighth signal when a phase shift of the fifth signal is 0 (that is, phase adjustment is not performed). Curve 2 indicates a corresponding eighth signal when a phase shift of the fifth signal is 20°. Curve 3 indicates a corresponding eighth signal when a phase shift of the fifth signal is 40°. For ease of comparison, a phase-amplitude curve of the modulated signal, that is, curve 0, is also added to FIG. 3.

It may be learned from a comparison between curve 2 or 3 and curve 1 that an amplitude value of the eighth signal becomes smaller after a phase of the fifth signal is adjusted. It may be learned from a comparison between curve 2 and curve 3 that an amplitude value of the eighth signal may be controlled by adjusting a phase shift of the fifth signal, and a larger phase shift of the fifth signal leads to a smaller amplitude of the eighth signal.

The second circuit 202 includes the primary power amplifier branch and the secondary power amplifier branch. The primary power amplifier branch includes the outphasing circuit, and the secondary power amplifier branch includes the secondary power amplifier. The outphasing circuit usually operates in a class B or class AB condition, and the secondary power amplifier usually operates in a class C condition. When the second circuit 202 operates, the outphasing circuit remains enabled, but the secondary power amplifier is not started at the beginning. The secondary power amplifier is started to perform amplification processing on the eighth signal only when an amplitude of the eighth signal input to a signal input end of the secondary power amplifier reaches a minimum signal amplitude that can start the secondary power amplifier, that is, reaches a signal threshold corresponding to a conduction angle. It may be understood that, when an amplitude of the modulated signal is relatively small, the decomposition phase of the modulated signal is relatively large, the amplitude of the eighth signal is relatively small, and the secondary power amplifier is not started. When an amplitude of the modulated signal is relatively large, the decomposition phase of the modulated signal is relatively small, the amplitude of the eighth signal is relatively large, and the secondary power amplifier is started. Therefore, the secondary power amplifier is started only when the amplitude of the modulated signal is relatively large, and power amplification efficiency of the circuit is improved.

In the prior art, a secondary power amplifier is usually adjusted to a deep class C (that is, a conduction angle of the secondary power amplifier is relatively small, for example, 100°) condition using a grid voltage bias, to ensure that the secondary power amplifier is started only when an amplitude of a signal that is input to the secondary power amplifier reaches a signal threshold. A smaller conduction angle of the secondary power amplifier leads to a larger signal threshold corresponding to the secondary power amplifier. However, if the conduction angle of the secondary power amplifier is relatively small, after the secondary power amplifier is started, both saturation power and a gain of the second circuit 202 are severely affected. Consequently, saturation power of the radio frequency circuit is relatively small, a gain curve of the circuit is severely compressed, and an actual application requirement cannot be satisfied. If the conduction angle of the secondary power amplifier is increased by adjusting the grid voltage bias, the signal threshold corresponding to the secondary power amplifier becomes small, so that the eighth signal can reach the signal threshold even when the amplitude of the modulated signal is relatively small, and therefore the secondary power amplifier is started. However, because an amplitude of the input signal is relatively small, power amplification efficiency of the radio frequency circuit is relatively low. Therefore, in the prior art, the power amplification efficiency and the saturation power of the radio frequency circuit cannot be balanced. The power amplification efficiency of the circuit is ensured at the expense of the saturation power and a linear characteristic of the circuit.

In this embodiment, the amplitude value of the eighth signal is adjusted by adjusting different phases of the fifth signal, and saturation power of the circuit can be improved when power amplification efficiency of the circuit is ensured. Specifically, first, because the amplitude of the eighth signal becomes smaller, in this embodiment, the signal threshold corresponding to the secondary power amplifier can be properly reduced with an assurance that the eighth signal cannot reach the signal threshold when the amplitude of the modulated signal is relatively small. Therefore, the power amplification efficiency of the circuit is ensured. Second, in this embodiment, the signal threshold corresponding to the secondary power amplifier may be reduced, and therefore, the secondary power amplifier can be adjusted to a light class C (that is, the conduction angle of the secondary power amplifier is relatively large. For the radio frequency circuit provided in the present application, the conduction angle of the secondary power amplifier may be a value greater than 120°, for example, 160°) using the grid voltage bias of the secondary power amplifier. In this way, after the secondary power amplifier is started, saturation power of the second circuit 202 is increased. In conclusion, in this embodiment, the saturation power of the second circuit 202 can be improved without reducing power amplification efficiency of the second circuit 202.

For example, in FIG. 3, a criterion for adjusting the fifth signal by the microstrip or another circuit or component may be as follows. The phase of the fifth signal is adjusted, so that a first phase value is greater than a second phase value. The first phase value is a phase value of the first signal corresponding to an intersection point of the phase-amplitude curve of the eighth signal and the phase-amplitude curve (curve 0) of the modulated signal. The second phase value is a phase value of the first signal corresponding to a power back-off point of the second circuit. This can ensure that the secondary power amplifier can remain in a switch-off state during power back-off, and can be rapidly started when power of the eighth signal is greater than power at the power back-off point.

Figure 2:
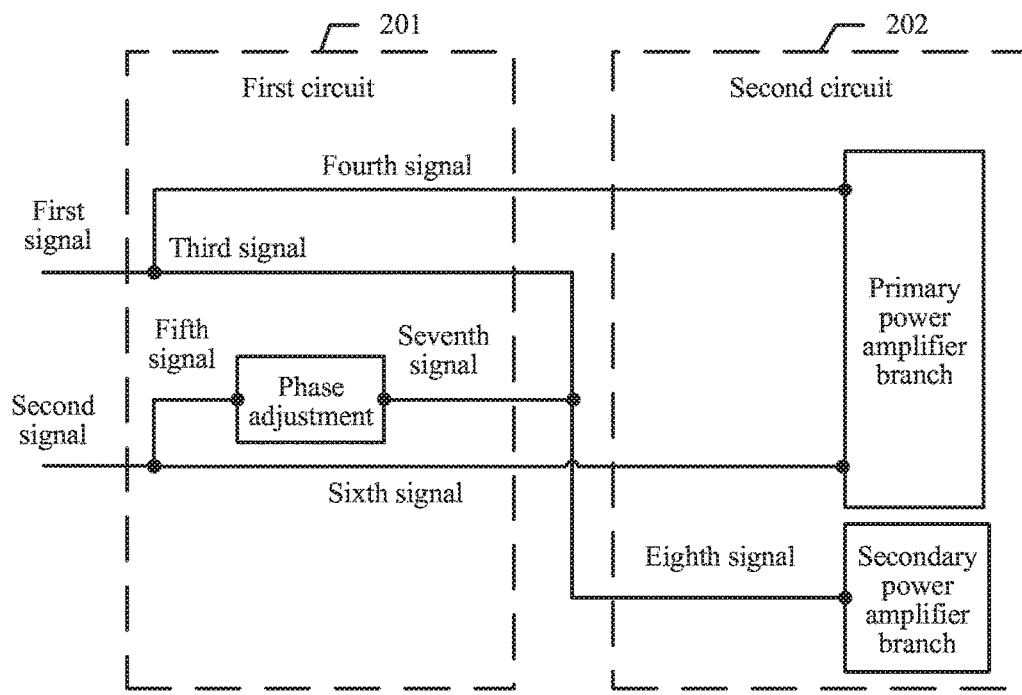
FIG. 2 is a schematic structural diagram of a radio frequency circuit according to an embodiment of the present disclosure.
Figure 4:
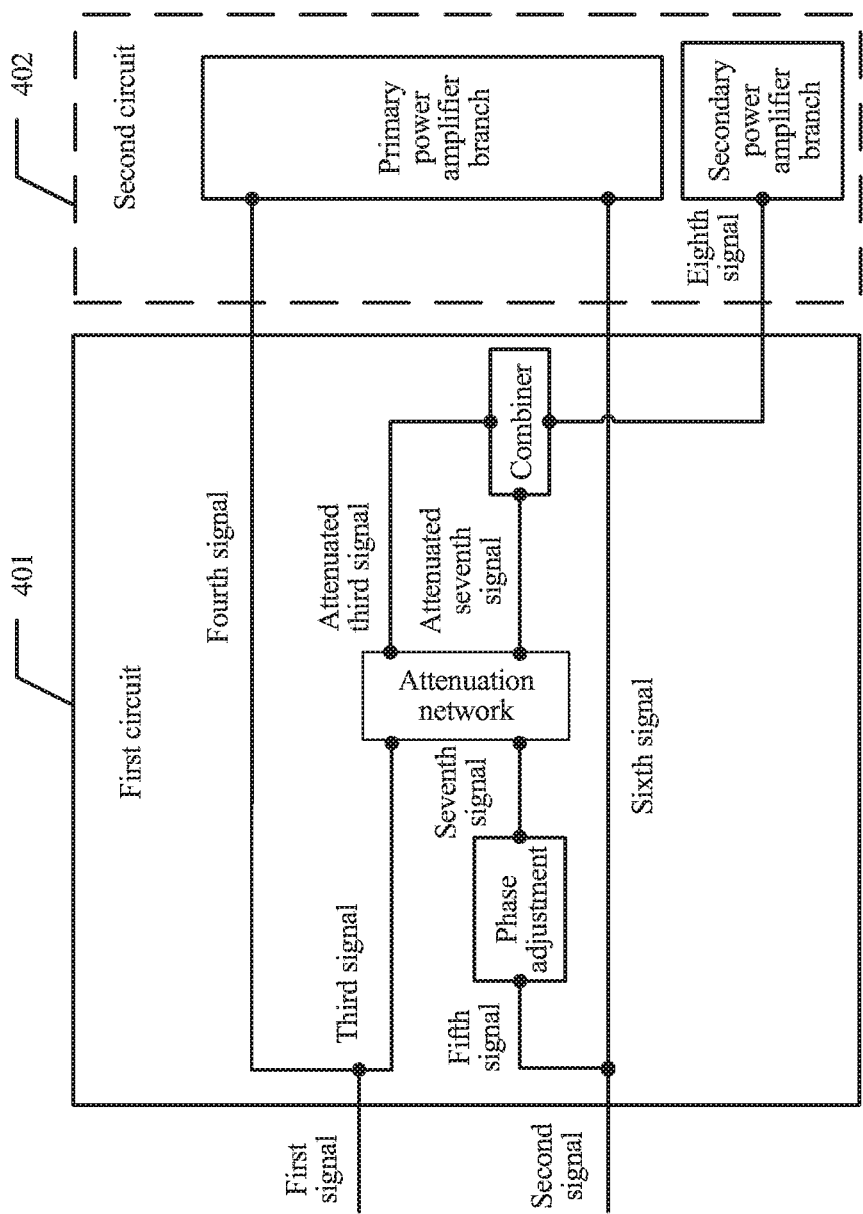
FIG. 4 is a schematic structural diagram of another radio frequency circuit according to an embodiment of the present disclosure.

Based on the embodiment shown in FIG. 2, an embodiment of the present disclosure further provides a more refined radio frequency circuit that is configured to implement more additional functions after a first signal and a second signal are obtained by performing phase decomposition on a modulated signal. Referring to FIG. 4, a basic structure of the radio frequency circuit includes a first circuit 401 and a second circuit 402.

The first circuit 401 is configured to receive the first signal and the second signal, where the first signal and the second signal are obtained by performing phase decomposition on the modulated signal. The first circuit 401 is also configured to split the first signal into a third signal and a fourth signal, and split the second signal into a fifth signal and a sixth signal. The first circuit 401 is also configured to adjust a phase of the fifth signal to obtain a seventh signal. Signal splitting may be implemented by a circuit or a component such as a coupler or a power splitter, and this is not limited herein. The phase of the fifth signal may be adjusted by a microstrip, a delay line, a variable capacitance diode, a phase shifter, or another circuit or component, and this is not limited herein. The first circuit 401 further includes an attenuation network and a combiner. The attenuation network is configured to attenuate the seventh signal and the third signal. The combiner is configured to combine the attenuated seventh signal and the attenuated third signal into an eighth signal. The combiner may be a circuit or a component such as a coupler or a power splitter, and this is not limited herein. The combiner may further include a microstrip, a delay line, a variable capacitance diode, a phase shifter, or another circuit or component that is configured to perform phase adjustment on the attenuated third signal or the attenuated seventh signal, to compensate for a phase shift of a circuit or a component such as a coupler or a power splitter.

The second circuit 402 is basically the same as the second circuit 202 shown in FIG. 2, and details are not described herein again.

Figure 5:
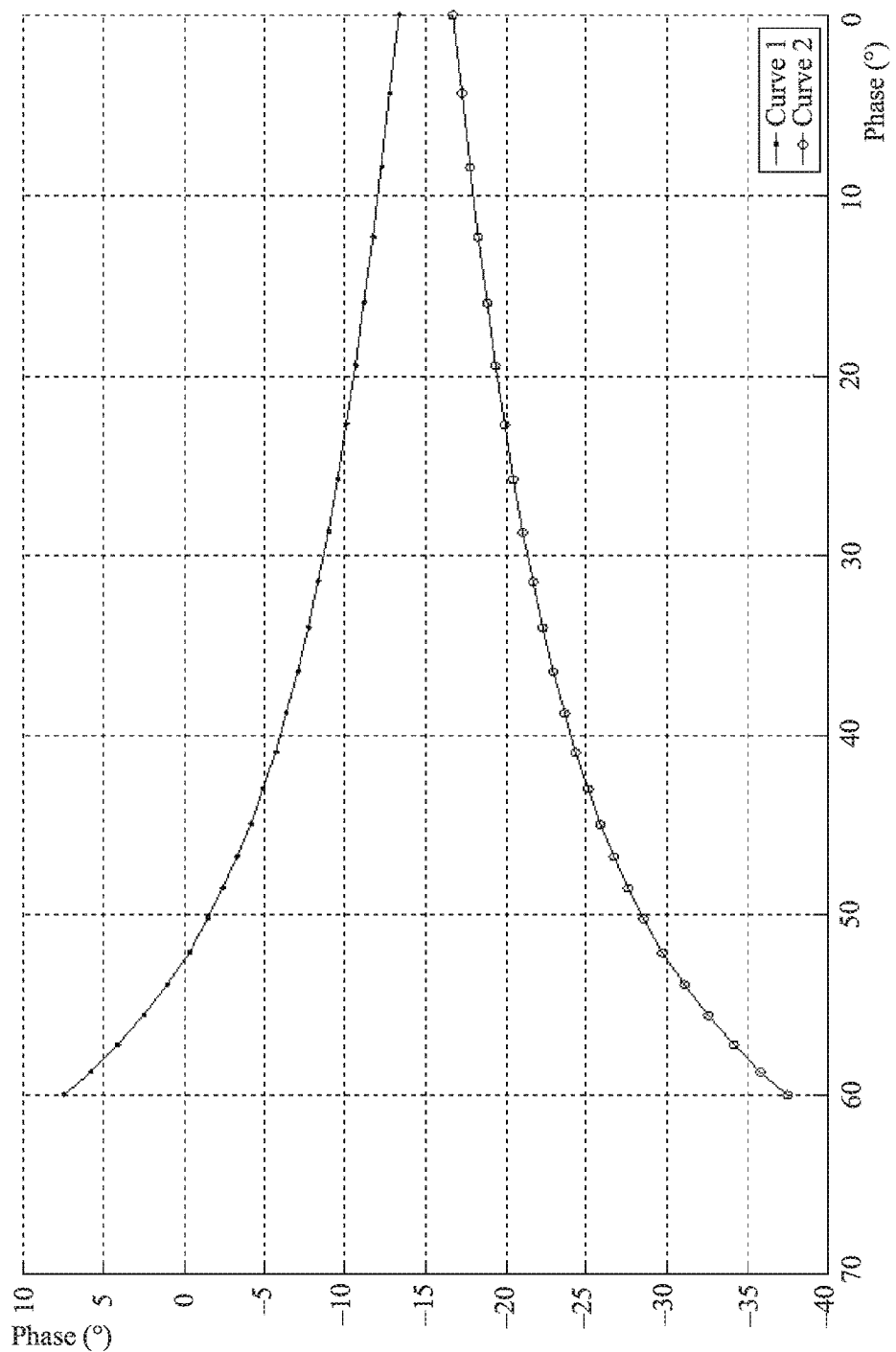
FIG. 5 shows a phase-phase curve of an eighth signal in a radio frequency circuit according to an embodiment of the present disclosure.

The attenuation network of the first circuit 401 attenuates the seventh signal and the third signal, so that amplitudes of the seventh signal and the third signal can be adjusted. Referring to FIG. 5, when the amplitudes of the seventh signal and the third signal vary, a phase of the eighth signal obtained after combination varies.

In FIG. 5, curve 1 indicates a phase-phase curve of the eighth signal when the amplitude of the seventh signal is 1 V, the amplitude of the third signal is 0.8 V, and a phase shift of the fifth signal is 30°. In FIG. 5, curve 2 indicates a phase-phase curve of the eighth signal when the amplitude of the seventh signal is attenuated to 0.8 V, the amplitude of the third signal is 1 V, and a phase shift of the fifth signal is 30°. A horizontal coordinate axis indicates a decomposition phase of the modulated signal, and a vertical coordinate axis indicates the phase of the eighth signal. It may be learned from FIG. 5 that, when the amplitudes of the seventh signal and the third signal vary, the phase of the eighth signal obtained after combination varies. Therefore, the phase of the eighth signal can be controlled by disposing an attenuation network to adjust the amplitudes of the seventh signal and the third signal. Therefore, according to the radio frequency circuit provided in the embodiment shown in FIG. 4, an AM-PM characteristic of the eighth signal can be adjusted, a linear correction effect of the radio frequency circuit is improved, and distortion of an output signal of the radio frequency circuit is reduced. The AM-PM characteristic refers to that amplitude variation of the input signal causes a variation of a phase difference between an input signal of an amplifier and an output signal of the amplifier.

Optionally, in this embodiment of the present disclosure, components such as the microstrip or another circuit or component for adjusting the phase of the fifth signal, the attenuation network, and/or the combiner may be replaced with a chip having an amplitude modulation and/or a phase modulation function. This is not limited in this embodiment of the present disclosure.

An embodiment of the present disclosure further provides a transmitter including the radio frequency circuit described in FIG. 2 or FIG. 4. The transmitter provided in this embodiment of the present disclosure may be used in a radio frequency part of a base station, for example, in a remote radio unit (RRU), or may be used in a base transceiver station (BTS), or may be used in a user terminal, or may be used in another communications apparatus or device. This is not limited herein.

Figure 6:
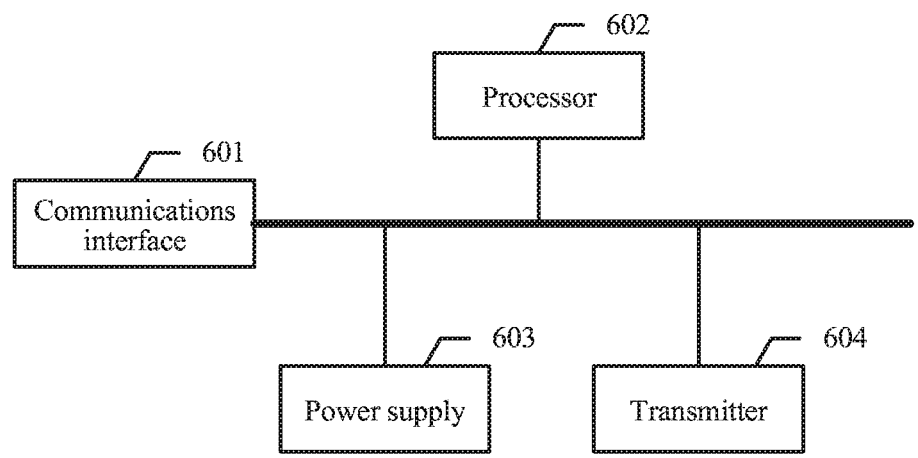
FIG. 6 is a schematic structural diagram of a base station according to an embodiment of the present disclosure.
Figure 7:
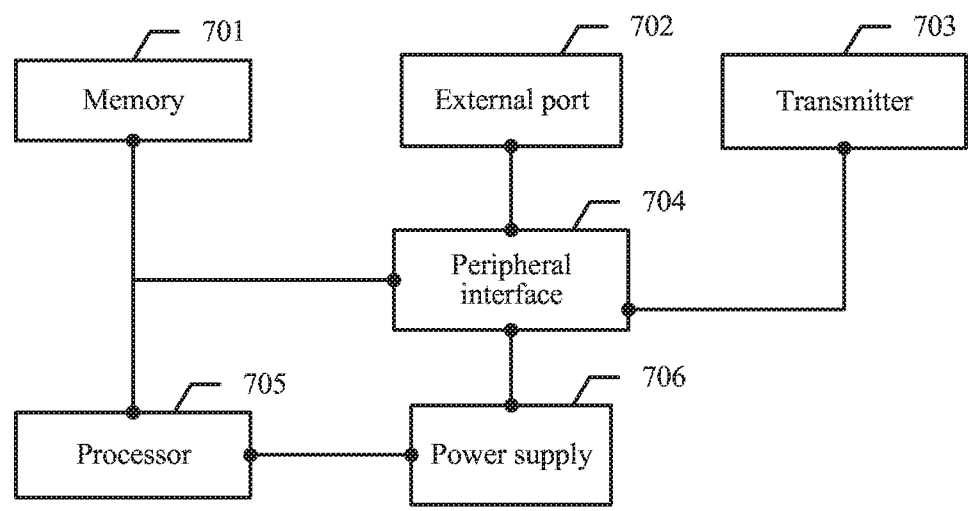
FIG. 7 is a schematic structural diagram of a user terminal according to an embodiment of the present disclosure.

Still further, referring to FIG. 6, an embodiment of the present disclosure further provides a base station including a communications interface 601, a processor 602, a power supply 603, and a transmitter 604. The transmitter 604 is the transmitter described in the foregoing embodiment. It may be understood that the base station provided in this embodiment of the present disclosure may further include some other structures such as general-purpose apparatus, modules, and circuits that are not shown in this figure.

Still further, an embodiment of the present disclosure further provides a user terminal including a memory 701, an external port 702, a transmitter 703, a peripheral interface 704, a processor 705, and a power supply 706. The transmitter 703 is the transmitter described in the foregoing embodiment. It may be understood that the user terminal provided in this embodiment of the present disclosure may further include some other structures such as general-purpose apparatus, modules, and circuits that are not shown in this figure.

It may be clearly understood by a person skilled in the art that, for the purpose of convenient and brief description, for a detailed working process of the foregoing system, module, and unit, reference may be made to a corresponding process in the foregoing method embodiments, and details are not described herein again.

In the several embodiments provided in this application, it should be understood that the disclosed system and method may be implemented in other manners. For example, the described system embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the modules or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present disclosure. The foregoing storage medium includes: any medium that can store program code, such as a USB flash drive, a removable hard disk, a read-only memory (ROM), a random access memory (RAM), a magnetic disk, or an optical disc.

What is claimed is:

1. A device, comprising:
    a receiver, configured to receive a first signal and a second signal;
    a first splitter, configured to split the first signal into a third signal and a fourth signal,
    a second splitter, configured to split the second signal into a fifth signal and a sixth signal;
    a phase adjuster, configured to adjust a phase of the fifth signal to obtain a seventh signal; and
    a combiner, configured to combine the seventh signal and the third signal into an eighth signal.

2. The device according to claim 1, wherein the phase adjuster comprises a first device, and the first device is a microstrip, a delay line, a variable capacitance diode, or a phase shifter; and wherein the first device is configured to adjust the phase of the fifth signal.

3. The device according to claim 1, wherein the first splitter comprises a first coupler or a first power splitter; and wherein the second splitter comprises a second coupler or a second power splitter.

4. The device according to claim 1, wherein the combiner comprises a third coupler or a third splitter.

5. The device according to claim 1, further comprising an attenuation network, configured to attenuate the seventh signal and the third signal.

6. The device according to claim 1, wherein the first signal and the second signal have identical amplitudes and reverse phases.

7. An apparatus, comprising a circuit, the circuit comprising:

a receiving circuit, configured to receive a first signal and a second signal;

a splitting circuit, configured to split the first signal into a third signal and a fourth signal, and split the second signal into a fifth signal and a sixth signal;

a phase adjustment circuit, configured to adjust a phase of the fifth signal to obtain a seventh signal; and a combining circuit, configured to combine the seventh signal and the third signal into an eighth signal.

8. The apparatus according to claim 7, wherein the phase adjustment circuit comprises a microstrip, a delay line, a variable capacitance diode, or a phase shifter.

9. The apparatus according to claim 7, wherein the splitting circuit comprises a first device, the first device is a first coupler or a first power splitter, and the first device is configured to split the first signal into the third signal and the fourth signal; and wherein the splitting circuit further comprises a second device, the second device is a second coupler or a second power splitter, and the second device is configured to split the second signal into the fifth signal and the sixth signal.

10. The apparatus according to claim 7, wherein the combining circuit comprises a combiner.

11. The apparatus according to claim 7, wherein the circuit further comprises an attenuation network, configured to attenuate the seventh signal and the third signal.

12. The apparatus according to claim 7, wherein the first signal and the second signal have identical amplitudes and reverse phases.

13. A method, comprising:

receiving, by a circuit, a first signal and a second signal;

splitting, by the circuit, the first signal into a third signal and a fourth signal, and splitting the second signal into a fifth signal and a sixth signal;

adjusting, by the circuit, a phase of the fifth signal to obtain a seventh signal; and combining, by the circuit, the seventh signal and the third signal into an eighth signal.

14. The method according to claim 13, wherein the circuit comprises a first device, and the first device is a microstrip, a delay line, a variable capacitance diode, or a phase shifter, and wherein adjusting, by the circuit, a phase of the fifth signal to obtain a seventh signal comprises adjusting, by the first device, the phase of the fifth signal to obtain the seventh signal.

15. The method according to claim 13, wherein the circuit comprises a first coupler and a second coupler; and wherein splitting, by the circuit, the first signal into a third signal and a fourth signal, and splitting the second signal into a fifth signal and a sixth signal comprises:

splitting, by the first coupler, the first signal into the third signal and the fourth signal, and splitting, by the second coupler, the second signal into the fifth signal and the sixth signal.

16. The method according to claim 13, wherein the circuit comprises a combiner; and wherein combining, by the circuit, the seventh signal and the third signal into an eighth signal comprises combining, by the combiner, the seventh signal and the third signal into the eighth signal.

17. The method according to claim 13, wherein the circuit further comprises an attenuation network, and the method further comprises:

attenuating, by the attenuation network, the seventh signal and the third signal.

18. The method according to claim 13, wherein the first signal and the second signal have identical amplitudes and reverse phases.

* * * * *